US012563693B2

(12) United States Patent
Mosti et al.

(10) Patent No.: US 12,563,693 B2
(45) Date of Patent: Feb. 24, 2026

(54) ADAPTOR FOR A DEVICE RACK

(71) Applicant: Telefonaktiebolaget LM Ericsson (publ), Stockholm (SE)

(72) Inventors: Sergio Mosti, Genoa (IT); Claudio D'Incà, Genoa (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 236 days.

(21) Appl. No.: 18/257,049

(22) PCT Filed: Dec. 15, 2020

(86) PCT No.: PCT/EP2020/086057
§ 371 (c)(1),
(2) Date: Jun. 12, 2023

(87) PCT Pub. No.: WO2022/128065
PCT Pub. Date: Jun. 23, 2022

(65) Prior Publication Data
US 2024/0057279 A1     Feb. 15, 2024

(51) Int. Cl.
*H05K 7/14* (2006.01)
*H05K 7/18* (2006.01)
*A47B 97/00* (2006.01)

(52) U.S. Cl.
CPC ......... *H05K 7/1489* (2013.01); *H05K 7/1427* (2013.01); *H05K 7/186* (2013.01);
(Continued)

(58) Field of Classification Search
CPC ........ H05K 7/1489; H05K 7/186; H05K 5/00; H05K 7/14; H05K 7/1427; H05K 7/18;
(Continued)

(56) References Cited

U.S. PATENT DOCUMENTS

| | | | |
|---|---|---|---|
| 4,247,882 A | 1/1981 | Prager et al. | |
| 5,209,356 A * | 5/1993 | Chaffee | A47B 81/064 |
| | | | 361/725 |

(Continued)

FOREIGN PATENT DOCUMENTS

| | | |
|---|---|---|
| EP | 2681924 A1 | 1/2014 |
| WO | 2012119638 A1 | 9/2012 |

*Primary Examiner* — Devin K Barnett
(74) *Attorney, Agent, or Firm* — Sonoda & Kobayashi Intellectual Property Law; Darren M. Gardner

(57) ABSTRACT

An adaptor for mounting one or more substantially planar first electronic devices on a device rack is provided. The adaptor comprises a coupling portion for coupling to the device rack; and a mounting portion comprising one or more adaptor mounting points for mounting the first electronic devices on the adaptor. The mounting portion is movable relative to the coupling portion between a first position and a second position such that, when the adaptor is coupled to the device rack and the mounting portion is in the first position, the first electronic devices mounted on the adaptor are located within the device rack and are mounted on one or more planes which extend vertically and laterally relative to the device rack, and when the mounting portion is in the second position, the first electronic devices mounted on the adaptor are located at least partially outside of the device rack.

15 Claims, 9 Drawing Sheets

(52) U.S. Cl.
   CPC .......... *A47B 2097/006* (2013.01); *H05K 7/14*
   (2013.01); *H05K 7/18* (2013.01)

(58) Field of Classification Search
   CPC . H04Q 2201/02; H04Q 1/02; A47B 2097/006
   USPC .......................................................... 211/26
   See application file for complete search history.

(56)                References Cited

U.S. PATENT DOCUMENTS

| | | | | |
|---|---|---|---|---|
| 5,540,339 | A * | 7/1996 | Lerman ................. | E05D 15/502 |
| | | | | 312/324 |
| 5,584,396 | A * | 12/1996 | Schmitt ................... | H02B 1/36 |
| | | | | 211/26 |
| 6,065,612 | A * | 5/2000 | Rinderer ................. | H05K 7/16 |
| | | | | 211/175 |
| 6,269,959 | B1 * | 8/2001 | Haworth .............. | H05K 7/1421 |
| | | | | 361/829 |
| 6,530,551 | B2 * | 3/2003 | Gan ..................... | G11B 33/128 |
| | | | | 312/265.5 |
| 6,538,879 | B2 * | 3/2003 | Jiang ........................ | G06F 1/184 |
| | | | | 312/223.1 |
| 6,814,244 | B1 * | 11/2004 | Hathcock .............. | E05D 15/502 |
| | | | | 49/193 |
| 7,016,190 | B1 * | 3/2006 | Chang ................. | G11B 33/124 |
| | | | | 248/221.11 |
| 7,360,659 | B1 * | 4/2008 | Yoon ........................ | H05K 7/16 |
| | | | | 292/60 |
| 7,518,863 | B2 * | 4/2009 | Wayman ................ | H05K 7/186 |
| | | | | 165/185 |
| 7,772,489 | B2 * | 8/2010 | Adducci ................ | H02B 1/202 |
| | | | | 361/600 |
| 8,573,715 | B1 * | 11/2013 | Jackman ................ | A47K 10/32 |
| | | | | 49/382 |
| 8,859,136 | B2 * | 10/2014 | Fujisawa ............. | H01M 8/2475 |
| | | | | 312/223.5 |
| 8,958,206 | B2 * | 2/2015 | French, Jr. .............. | G06F 1/181 |
| | | | | 361/679.58 |
| 8,966,821 | B2 * | 3/2015 | Walker .................. | E05D 15/505 |
| | | | | 49/382 |
| 10,559,326 | B1 * | 2/2020 | Lin .......................... | H05K 7/12 |
| 10,803,907 | B2 * | 10/2020 | Schroeder ............ | G11B 33/128 |
| 11,490,542 | B1 * | 11/2022 | Darche ................... | H04Q 1/13 |
| 11,602,069 | B2 * | 3/2023 | Sheehan ............ | H05K 7/20736 |
| 11,758,679 | B2 * | 9/2023 | Tsorng ................. | H05K 7/1491 |
| | | | | 211/26 |
| 2004/0016713 | A1 * | 1/2004 | Wyatt ...................... | H02B 1/01 |
| | | | | 211/183 |
| 2007/0247809 | A1 * | 10/2007 | McClure .................. | G06F 1/20 |
| | | | | 361/695 |
| 2011/0180497 | A1 * | 7/2011 | Zhang .................. | H05K 7/1489 |
| | | | | 211/26 |
| 2014/0076831 | A1 * | 3/2014 | Mathewson ........... | H05K 7/186 |
| | | | | 211/26 |
| 2014/0375196 | A1 * | 12/2014 | Nguyen .............. | E05D 15/507 |
| | | | | 29/592 |
| 2015/0090677 | A1 * | 4/2015 | Shao .................... | H05K 7/1489 |
| | | | | 211/26 |
| 2015/0201520 | A1 * | 7/2015 | Jau ........................ | G11B 33/124 |
| | | | | 211/26 |
| 2017/0060176 | A1 * | 3/2017 | Lien ........................ | G06F 1/187 |
| 2023/0097307 | A1 * | 3/2023 | Buana ................. | H05K 7/1488 |
| | | | | 211/26 |

* cited by examiner

1102 — Couple adaptor to device rack

Mount electronic devices — 1104

1106 — Move adaptor mounting portion

ADAPTOR FOR A DEVICE RACK

TECHNICAL FIELD

The present disclosure relates to adaptors for a device rack and is particularly, although not exclusively, concerned with adaptors for enabling devices of different dimensions to be mounted on the same device rack.

BACKGROUND

Electronic devices, e.g. rack mountable electronic devices, are often mounted on a device rack with standard dimensions, such as a European Telecommunications Standards Institute (ETSI) standard device rack or an American National Standards Institute (ANSI) standard device rack. With reference to FIG. 1, such device racks 2 typically extend in a longitudinal, e.g. vertical, direction $D_1$ and are designed to enable a plurality of the rack mountable electronic devices to be mounted on the rack, spaced apart from one another in the longitudinal direction $D_1$.

The electronic devices are generally planar in shape and may be mounted on the device rack such that the electronic devices are mounted on one or more rack device planes $P_{DR}$ on the device rack. In other words, the electronic devices may be generally disposed in, or parallel with, the rack device planes $P_{DR}$ when mounted on the device rack. As depicted in FIG. 1, the rack device planes $P_{DR}$ may be perpendicular to the longitudinal, e.g. vertical, direction $D_1$ of the device rack. Accordingly, the rack device plane may be parallel with lateral and depth directions $D_2$, $D_3$ of the device rack, mounted in horizontal planes.

The device rack 2 comprises a plurality of coupling points 6, such as fastener openings, spaced along one or more coupling surfaces 4 of the device rack 2. As shown in FIG. 1, coupling surfaces 4 are provided at each lateral side of the device rack 2 and extend along the device rack in the longitudinal (vertical) direction $D_1$ such that the coupling points are arranged in a first plane $P_1$ of the device rack, e.g. which is parallel with the longitudinal direction $D_1$ and the lateral direction $D_2$ of the device rack 2.

The coupling points 6 may be in pairs (e.g. first, second and third pairs 6a, 6b, 6c indicated in FIG. 1), with one coupling point of each pair on either lateral side of the device rack 2. The electronic devices to be mounted on the device rack may be coupled to one or more pairs of the coupling points, e.g. to one or more of the coupling points 6 at each lateral side of the device rack, to support the electronic device on the device rack, so that each electronic device is in a horizontal plane. The device rack defines an interior space 20 within which electronic device coupled to the coupling points are received.

The number of coupling points, e.g. the number of pairs of coupling points, used for coupling each electronic device to the device rack may depend, for example, on a dimension of the electronic device in the longitudinal direction $D_1$ of the rack and a support requirement of the electronic device.

The particular standards of electronic devices and corresponding device racks that are commonly used, for example, in data centres and telecommunications offices, e.g. central offices, may vary depending on the location of the data centre/office. For example, electronic devices and corresponding device racks following ETSI standards may be used within central offices in Europe, and devices and corresponding device racks following ANSI standards may be used within central offices in the United States of America.

Electronic devices that follow different standards may have different dimensions and the device racks for electronic devices following that standard are sized accordingly. For example, ETSI standard device racks may be sized to receive electronic devices having a maximum dimension of 280 mm in the depth direction $D_3$, whereas ANSI standard devices could have depth dimensions of over 280 mm, for example, 350 mm, and hence, may not be mountable on ETSI standard device racks. ANSI standard device racks may therefore be dimensioned to enable devices having a depth dimension of 350 mm or greater to be mounted on the device rack. For example, ANSI device racks may be capable of mounting electronic devices having depth dimensions of up to 600 mm.

With reference to FIGS. 2 to 5, in addition to size differences, active cooling systems of electronic devices following ETSI and ANSI standards may be configured to operate differently. For example, FIG. 2 depicts an electronic device 200 following ETSI standards. As shown, the ETSI standard electronic device is configured to receive an inlet airflow 250 into an inlet opening 212 on a first side surface 202 of the electronic device 200 and to output an outlet airflow 260 from an outlet opening 214 on a second side surface 204 of the electronic device, which is on an opposite side of the electronic device from the first side surface 202. Airflow for cooling the electronic device 200 is therefore established in the lateral direction $D_2$ of the device rack the electronic device 200 is mounted on.

In contrast to this, FIG. 3 shows an electronic device 300 following ANSI standards. As shown, the ANSI electronic device 300 is configured to receive an inlet airflow 350 into an inlet opening 312 on a front surface 302 of the electronic device 300 and to output an outlet airflow 360 from an outlet opening 314 on a rear surface 304 of the electronic device 300. Airflow for cooling the electronic device is therefore established in a depth direction $D_3$ of the device rack that the electronic device 300 is mounted on.

These differences in cooling airflow between ETSI and ANSI electronic devices are reflected in the typical arrangements of device racks within data centres/central offices housing ETSI and ANSI electronic devices respectively. FIG. 4 depicts an example arrangement of ETSI standard device racks 402, 404 in a data centre/office 400. As illustrated, the ETSI standard device racks 402, 404 may be arranged side-by-side and cooling air 406 may flow generally upwards, e.g. in the longitudinal direction $D_1$ of the device racks, in aisles 408, 410 between the device racks. The cooling air 406 may be drawn into the sides of the device racks 402, 404 to the electronic devices 200 mounted inside the device racks 402, 404. As illustrated in FIGS. 2 and 4, outlet air that has been output from the electronic devices 200 may rise upward within the device racks, e.g. after being output from the side outlets 214 of the electronic devices 200.

FIG. 5 depicts an example arrangement of ANSI standard device racks 502, 504 within a data centre/central office 500. As illustrated, the device racks 502, 504 following ANSI standards may be arranged in rows, with device racks in adjacent rows being arranged back-to-back. An aisle 506 is provided between the back-to-back device racks. The aisle 506 between the back-to-back racks may be referred to as a "hot aisle", as the outlet air that has been output from the electronic devices 300 may be exhausted from the device racks 502, 504 into the aisle 506. In contrast, aisles 508, 510 between fronts of the ANSI device racks 502, 504 may be "cold aisles" and air may be drawn from the aisles 508, 510, to be inlet into the electronic devices 300.

Due to both the differences in dimensions and airflow requirements for the active cooling systems of electronic devices following the ETSI and ANSI standards, it is difficult for operators of data centres/central offices housing predominantly ETSI or ANSI devices to incorporate a small number of devices of another standard into the data centre/central office without significant changes to the layout of the data centre/office and without the installation of one or more additional, dedicated device racks of the other standard for the small number of devices of the other standard to be mounted on.

SUMMARY

According to an aspect of the present disclosure, there is provided an adaptor for mounting one or more substantially planar, e.g. planar, first electronic devices on a device rack. The adaptor comprises a coupling portion for coupling to the device rack; and a mounting portion comprising one or more adaptor mounting points for mounting the first electronic devices on the adaptor. The mounting portion is movable relative to the coupling portion between a first position and a second position such that, when the adaptor is coupled to the device rack and the mounting portion is in the first position, the first electronic devices mounted on the adaptor are located within the device rack and are mounted on one or more planes which extend vertically and laterally relative to the device rack, and when the mounting portion is in the second position, the first electronic devices mounted on the adaptor are located at least partially outside of the device rack. In other words, the first electronic devices may be mounted on the adaptor such that the first electronic devices are generally disposed in planes which extend vertically and laterally relative to the device rack, when the mounting portion is in the first position.

The first electronic devices may be of a first type or according to a first standard.

The coupling portion of the adaptor may be to couple to the rack mounting points of the device rack, e.g. a standard, European Telecommunication Standard Institute (ETSI), device rack.

The coupling portion of the adaptor may be to couple to one or more rack mounting points of the device rack on one lateral side of the device rack. The mounting portion of the adaptor may be to couple to one or more rack mounting points of the device rack on an opposite lateral side of the device rack from the rack mounting points to which the coupling portion is coupled.

The adaptor may be configured such that, when the adaptor is coupled to the device rack and the mounting portion is in the first position, the first electronic devices mounted on the adaptor are received within the device rack and are arranged at an angle relative to the second electronic devices coupled to the rack mounting points.

The adaptor may be configured to couple to the device rack such that, when the mounting portion is in the first position the first electronic devices mounted on the adaptor are received within the device rack and are arranged such that a depth dimension of the first electronic devices is aligned with a lateral direction of the device rack.

The adaptor may be configured such that when the adaptor is coupled to the device rack and the mounting portion is in the second position, the electronic device mounted on the adaptor protrude out of the device rack by a greater amount than when the mounting portion is in the first position.

The adaptor mounting points may comprise one or more pairs of mounting points, each pair of mounting points for coupling to the same electronic device at opposite lateral sides of the electronic device. The mounting points in each pair of mounting points may be spaced apart from one another in a longitudinal direction of the device rack, when the adaptor is coupled to the device rack and the mounting portion is in the first position.

The mounting portion may be rotatable relative to the coupling portion. Additionally or alternatively, the mounting portion may be slideable relating to the coupling portion. For example, the mounting portion may be rotatably and/or slideably coupled to the coupling portion.

The device rack may comprise a plurality of rack mounting points arranged in a first plane for mounting one or more second electronic devices on the device rack. The second electronic devices may be of a second type or according to a second standard. The second electronic devices may be mountable on the device rack such that a depth dimension of the electronic devices extends perpendicular to the first plane. The second electronic devices may be mounted on the device rack in one or more planes perpendicular to the vertical direction of the device rack. Accordingly, the second electronic devices may be mounted at an angle, e.g. perpendicular to, the first electronic devices when the mounting portion is in the first position relative to the coupling portion. The one or more adaptor mounting points for mounting the first electronic devices on the adaptor may be arranged in a second plane. When the adaptor is coupled to the device rack and the mounting portion is in the first position, the second plane may be at an angle, e.g. perpendicular, relative to the first plane.

The adaptor may be configured such that when the adaptor is coupled to the device rack and the mounting portion is in the second position, the angle between the second plane and the first plane is less then when the mounting portion is in the first position. For example, when the mounting portion is in the second position, the second plane may be substantially parallel with the first plane.

The adaptor may comprise one or more vibration damping portions for damping vibrations of the first electronic devices mounted on the adaptor relative to the device rack and/or of the device rack relative to the first electronic devices mounted on the adaptor. The vibration damping portions may comprise portions of the adaptor having curved profiles in cross-sections in a planes parallel with directions in which the respective vibration damping portions are to damp vibrations.

The mounting portion may comprise one or more coupling points for coupling the mounting portion to the device rack, e.g. directly to the device rack. For example, the mounting portion may be (directly) coupled to the rack mounting points of the device rack. The coupling portion of the adaptor may be couplable to a first lateral side of the device rack and the coupling points of the mounting portion may be for coupling the mounting portion to a second lateral side of the device rack opposite the first lateral side.

According to another aspect of the present disclosure, there is provided an adaptor for mounting one or more first electronic devices, e.g. substantially planar first electronic devices, on a device rack. The device rack comprises a plurality of rack mounting points arranged in a first plane for mounting one or more second electronic devices on the device rack. The adaptor comprises: a coupling portion for coupling to the device rack; and a mounting portion comprising one or more adaptor mounting points arranged in a second plane for mounting the first electronic devices on the adaptor. The mounting portion is movable relative to the coupling portion between a first position and a second position such that, when the adaptor is coupled to the device rack and the mounting portion is in the first position, the first electronic devices mounted on the adaptor are received within the device rack and the second plane is at an angle, e.g. perpendicular, relative to the first plane.

According to another aspect of the present disclosure, there is provided a system for mounting electronic devices on a device rack. The system comprises: the device rack, wherein the device rack comprises a plurality of rack mounting points for mounting one or more electronic devices, e.g. second electronic devices, on the device rack; and an adaptor, wherein the adaptor comprises a coupling portion for coupling to the device rack, e.g. to the rack mounting points, and a mounting portion comprising one or more adaptor mounting points for mounting one or more electronic devices, e.g. first electronic devices, on the adaptor. The mounting portion is movable relative to the coupling portion between a first position and a second position such that, when the adaptor is coupled to the device rack and the mounting portion is in the first position, the electronic devices mounted on the adaptor are received within the device rack and are arranged at an angle relative to electronic devices coupled to the rack mounting points.

The rack mounting points may be arranged in a first plane and the adaptor mounting points may be arranged in a second plane. When the adaptor is coupled to the device rack and the mounting portion is in the first position, the second plane may be at an angle relative to the first plane.

According to another aspect of the present disclosure, there is provided a system for mounting one or more substantially planar, e.g. planar, first electronic devices on a device rack. The system comprises the device rack, wherein the device rack comprises a plurality of rack mounting points for mounting one or more second electronic devices on the device rack; and an adaptor, wherein the adaptor comprises a coupling portion for coupling to the device rack; and a mounting portion comprising one or more adaptor mounting points for mounting the first electronic devices on the adaptor. The mounting portion is movable relative to the coupling portion between a first position and a second position such that, when the adaptor is coupled to the device rack and the mounting portion is in the first position, the first electronic devices mounted on the adaptor are located within the device rack and are mounted on one or more planes which extend vertically and laterally relative to the device rack, and when the mounting portion is in the second position, the first electronic devices mounted on the adaptor are located at least partially outside of the device rack.

The adaptor may be the above-mentioned adaptor.

The device rack may be for mounting the second electronic devices such that a depth dimension of the second electronic devices extends in a depth dimension of the device rack. The device rack may be for mounting second electronic devices having a second maximum dimension in a depth dimension, and the adaptor may be configured for mounting first electronic devices having a first maximum dimension in the depth dimension of the first electronic devices, the first maximum dimension being greater than the second maximum dimension.

The adaptor may be couplable to the device rack such that, when the mounting portion is in the first position, the first electronic devices mounted on the adaptor are received within the device rack with a depth dimension of the first electronic devices being aligned with a lateral direction of the device rack.

The rack mounting points may comprise one or more pairs of mounting points, each pair of mounting points for coupling to the same second electronic device for mounting the second electronic device on the device rack. The mounting points in each pair of mounting points may be spaced apart from one another in a lateral direction of the device rack.

The adaptor mounting points may comprise one or more pairs of mounting points, each pair of mounting points for coupling to the same first electronic device, at opposite lateral sides of the first electronic device. The mounting points in each pair of mounting points may be spaced apart from one another in a longitudinal direction of the device rack, when the adaptor is coupled to the device rack and the mounting portion is in the first position and optionally when the adaptor is in the second position.

The device rack may be a European Telecommunication Standard Institute, ETSI, standard device rack. The adaptor may be for mounting American National Standards Institutes, ANSI, standard electronic devices.

According to another aspect of the present disclosure, there is provided a system for mounting one or more first electronic devices, e.g. substantially planar first electronic devices, on a device rack. The system comprises: the device rack, wherein the device rack comprises a plurality of rack mounting points arranged in a first plane for mounting one or more second electronic devices on the device rack; and an adaptor, wherein the adaptor comprises a coupling portion for coupling to the device rack, e.g. to the rack mounting points, and a mounting portion comprising one or more adaptor mounting points arranged in a second plane for mounting the one or more first electronic devices on the adaptor. The mounting portion is movable relative to the coupling portion between a first position and a second position such that, when the adaptor is coupled to the device rack and the mounting portion is in the first position, the first electronic devices mounted on the adaptor are received within the device rack and the second plane is at an angle, e.g. perpendicular, relative to the first plane.

According to another aspect of the present disclosure, there is provided a method of mounting one or more substantially planar, e.g. planar, first electronic devices on a device rack system. The system comprises a device rack comprising a plurality of rack mounting for mounting one or more second electronic devices on the device rack; and an adaptor comprising a coupling portion for coupling to the device rack and a mounting portion comprising one or more adaptor mounting points for mounting the one or more first electronic devices on the adaptor, wherein the mounting portion is movable relative to the coupling portion between a first position and a second position. The method comprises coupling the adaptor to the device rack such that when the adaptor is coupled to the device rack and the mounting portion is in the first position, the first electronic devices mounted on the adaptor are located within the device rack and are mounted on one or more planes which extend vertically and laterally relative to the device rack, and when the mounting portion is in the second position, the first electronic devices mounted on the adaptor are located at least partially outside of the device rack.

The method may comprise mounting the one or more first electronic devices on the adaptor. Additionally or alternatively, the method may further comprise moving the mounting portion of the adaptor between the first and second positions, e.g. from the second position to the first position relative to the coupling portion or from the first position to the second position.

According to another aspect of the present disclosure, there is provided a method of mounting one or more first electronic devices, e.g. of a first type or according to a first standard, on a device rack system. The system comprises a device rack comprising a plurality of rack mounting points arranged in a first plane for mounting one or more second electronic devices, e.g. of a second type or according to a second standard, on the device rack; and an adaptor comprising a coupling portion for coupling to the device rack, e.g. to the rack mounting points, and a mounting portion comprising one or more adaptor mounting points arranged in a second plane for mounting the one or more first electronic devices on the adaptor, wherein the mounting portion is movable relative to the coupling portion between a first position and a second position. The method comprises: coupling the adaptor to the device rack such that, when the mounting portion is in the first position, the first electronic devices mounted on the adaptor are received within the device rack and the second plane is at an angle, e.g. perpendicular, relative to the first plane.

To avoid unnecessary duplication of effort and repetition of text in the specification, certain features are described in relation to only one or several aspects or embodiments of the invention. However, it is to be understood that, where it is technically possible, features described in relation to any aspect or embodiment of the invention may also be used with any other aspect or embodiment of the invention.

BRIEF DESCRIPTION OF THE DRAWINGS

For a better understanding of the present invention, and to show more clearly how it may be carried into effect, reference will now be made, by way of example, to the accompanying drawings, in which:

FIG. 10 is a partial perspective view of the adaptor shown in FIGS. 6 to 8, illustrating a vibration damping portion of the adaptor.

DETAILED DESCRIPTION

Figure 6:
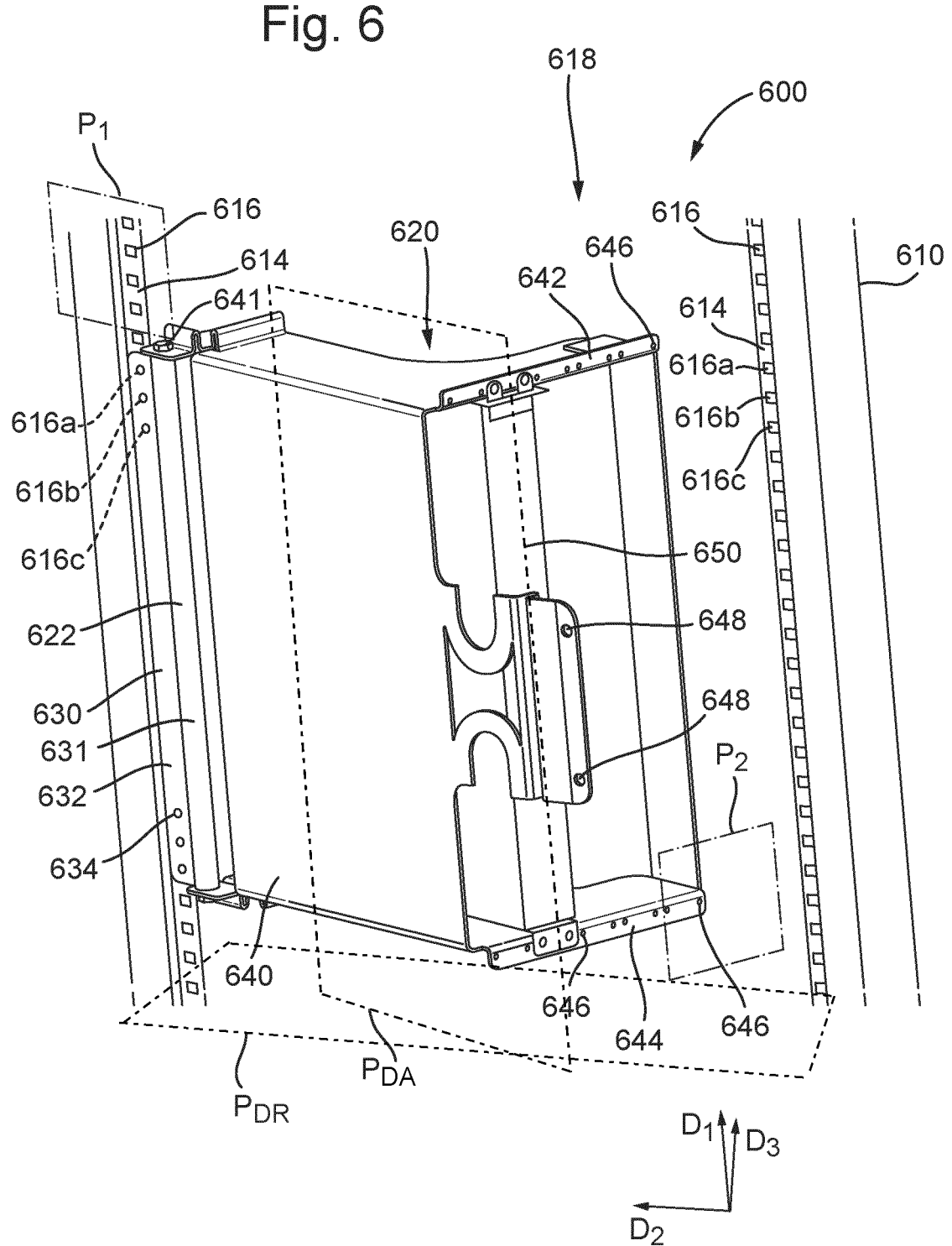
FIG. 6 is a front perspective view of a system for mounting electronic devices on a device rack according to the present disclosure.

With reference to FIG. 6, a system 600 according to the present disclosure for mounting electronic devices on a device rack 610 will now be described. The system 600 may enable one or more first electronic devices, e.g. of a first type or according to a first standard (e.g. ANSI), to be mounted on a device rack that is configured to enable second electronic devices, e.g. of a second type or according to a second standard (e.g. ETSI), to be mounted. For example, the system 600 may enable one or more electronic devices following the ANSI standard to be mounted on a device rack following the ETSI standard.

Figure 1:
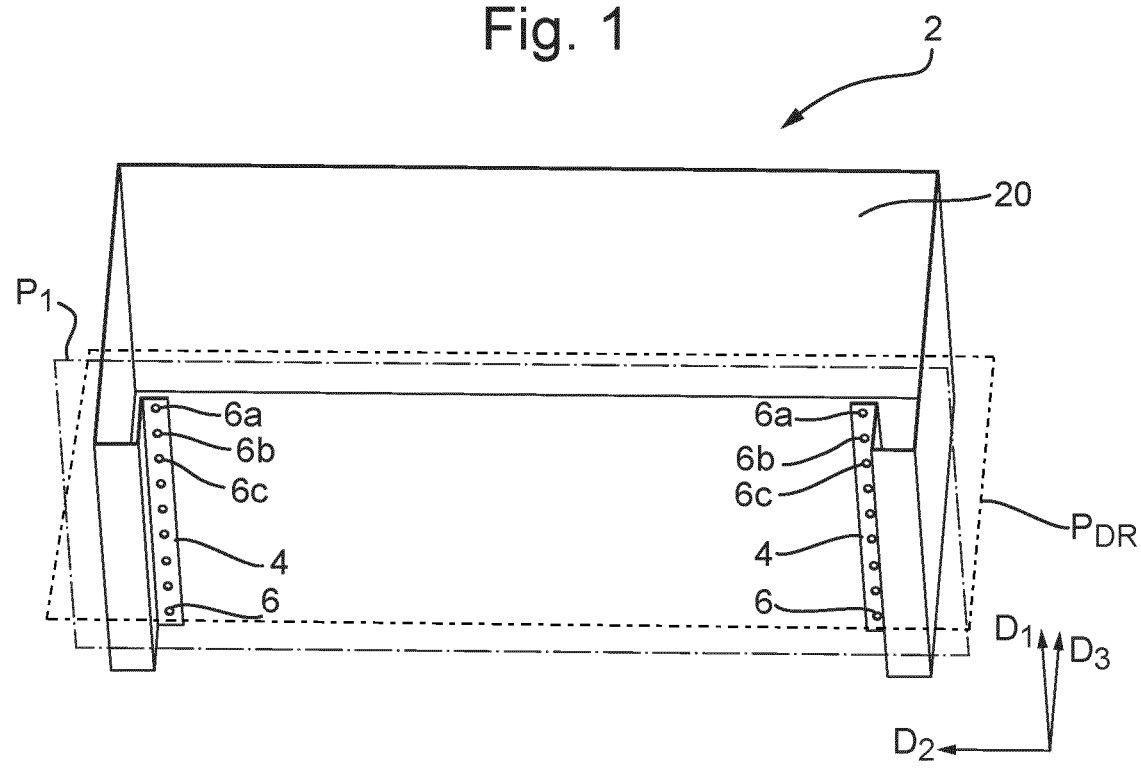
FIG. 1 is a perspective view of a device rack for mounting electronic devices.

The system 600 comprises the device rack 610 and an adaptor 620 couplable to the device rack 610. The device rack 610 is similar to the device rack 2 described above with reference to FIG. 1 and the features described in relation to the device rack 2 may apply equally to the device rack 610. In particular, the device rack 610 comprises a plurality of rack coupling points 616, such as fastener openings, spaced along one or more coupling surfaces 614 provided at each lateral side of the device rack 610, such that the rack coupling points 616 are arranged in a first plane P 1 of the device rack, e.g. which is parallel with the longitudinal direction $D_1$ and lateral direction $D_2$ of the device rack 610. As described with reference to FIG. 1, the rack coupling points 616 may be provided in pairs, such as first, second and third, pairs 616a, 616b, 616c, with one rack coupling point 616 in each pair being provided on each of the lateral sides of the device rack 610, configured to support electronic devices in a horizontal plane. The device rack defines an interior space 618 for receiving electronic devices coupled to the coupling points 616.

The device rack 610 may follow a standard, such as the ETSI standard. Accordingly, the rack may be sized and shaped to enable ETSI standard rack mountable electronic devices to be mounted on the device rack.

Figure 2:
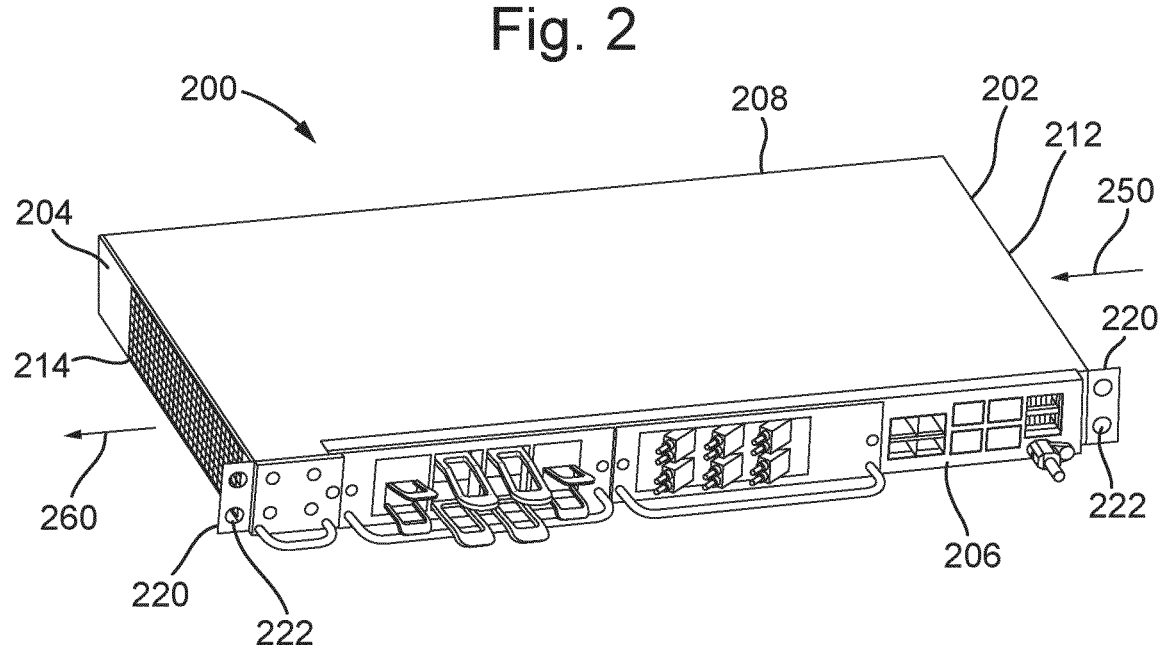
FIG. 2 is a perspective view of an ETSI standard rack mountable electronic device illustrating the direction of air flow through the device.
Figure 3:
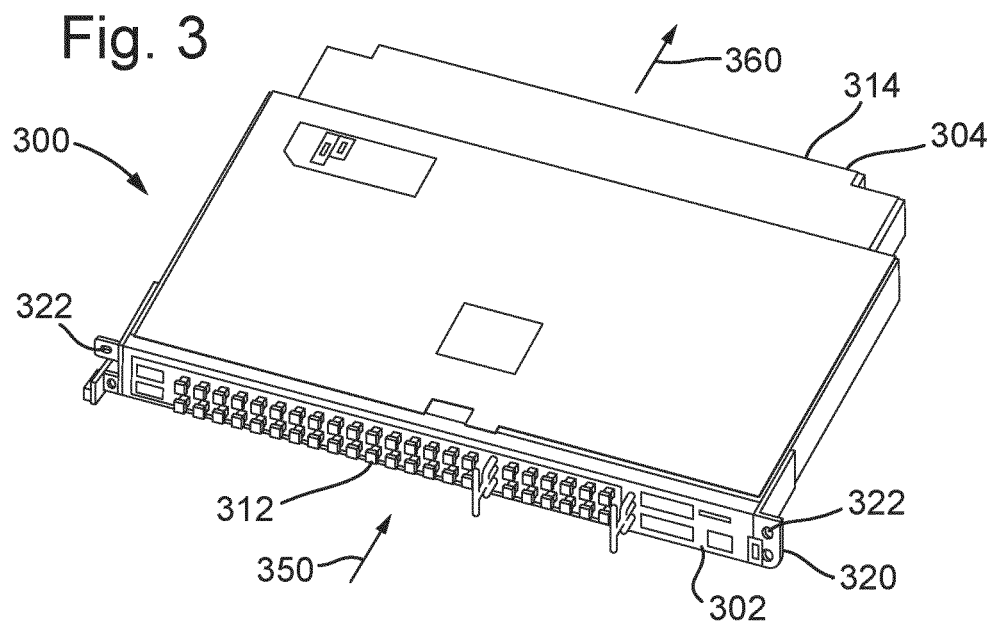
FIG. 3 is a perspective view of an ANSI standard rack mountable electronic device illustrating the direction of air flow through the device.
Figure 4:
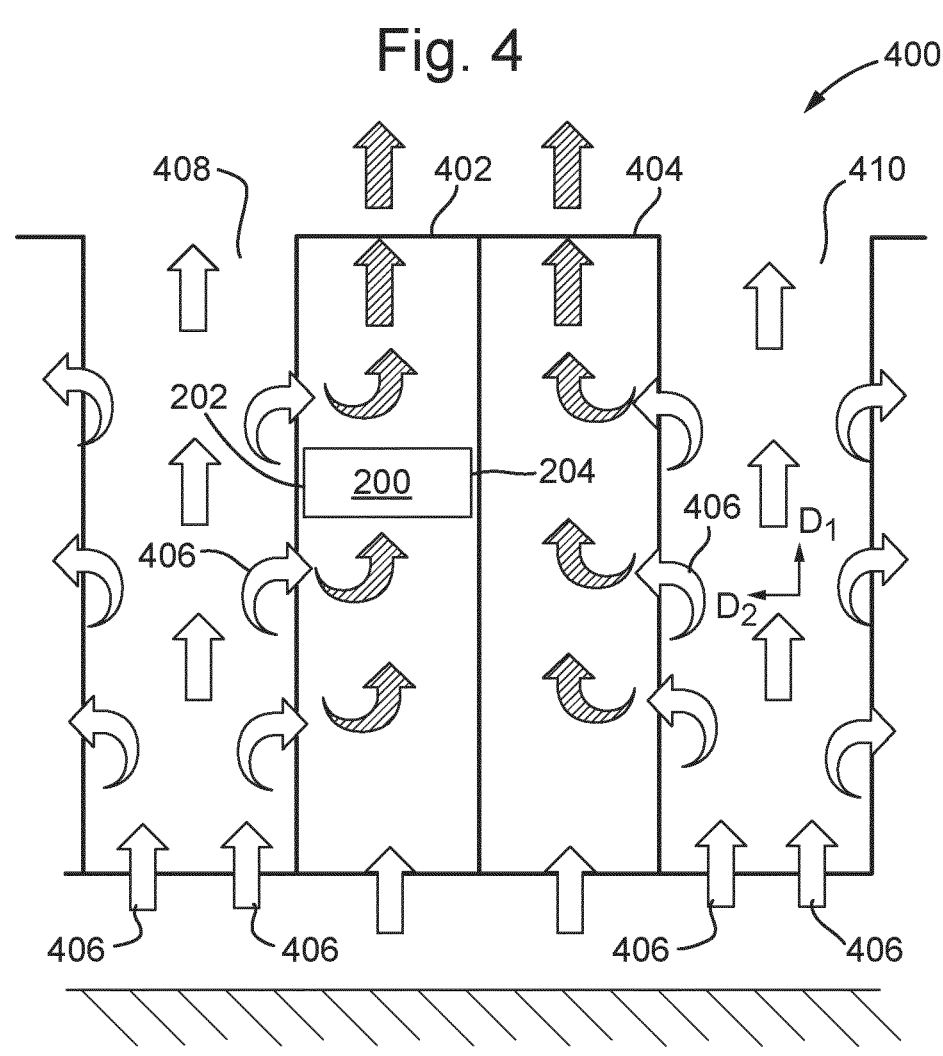
FIG. 4 is a front view showing an example layout of ETSI device racks within a data centre/office.
Figure 5:
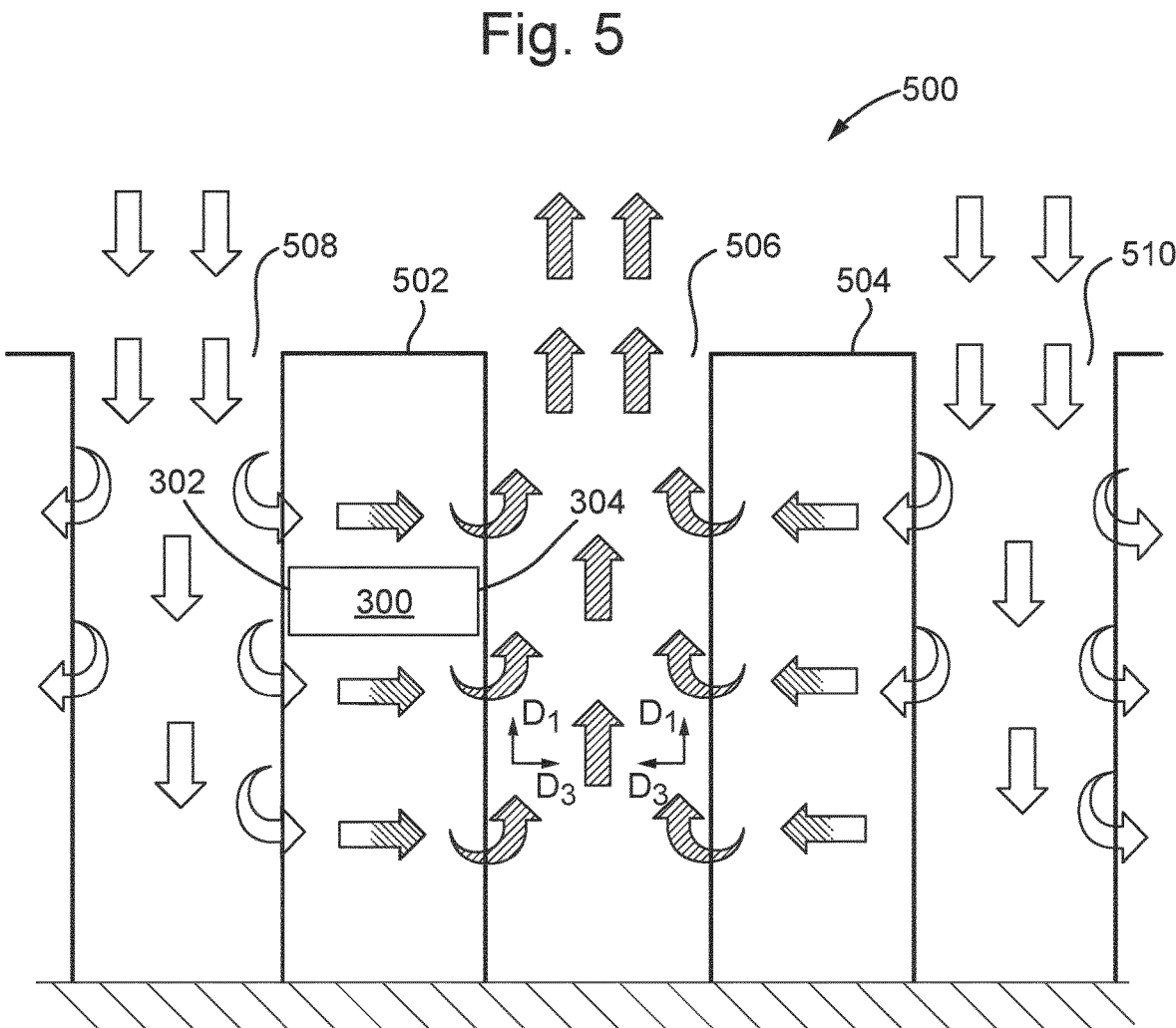
FIG. 5 is a side view showing an example layout of ANSI device racks within a data centre/office.

Returning briefly to FIGS. 2 and 3, the electronic devices 200, 300, may comprise device mounting brackets 220, 320 coupled to both lateral side surface of the electronic devices for coupling the electronic devices to the device rack. The device mounting brackets may comprise device coupling points 222, 322, e.g. fastener opening. A dimension between the device comping points provided on the device mounting bracket on one lateral side of the electronic device and the device coupling point provided on the device mounting bracket on the opposite lateral side of the electronic device may define a width of the electronic device and may be a standard dimension, such as 19 inches. The dimension may correspond to a dimension between rack coupling points in each pair of rack coupling points in the lateral direction $D_2$ of the device rack.

In order to mount the electronic devices on the device rack, the device coupling points 222, 322 provided on the mounting brackets 220, 320 on each lateral side of the electronic devices may be aligned with rack coupling points 616 on the coupling surfaces 614 on either lateral side of the device rack, e.g. with one or more pairs of the coupling points 616. Fasteners may then be used to couple the electronic device to the device rack at the coupling points. For example, fasteners, e.g. bolts, may be passed through fastener openings at the device coupling points 222, 322 and the rack coupling points 616.

As depicted, the device mounting brackets 220, 320 may be coupled to the electronic devices at or towards front faces 206, 302 of the device racks and may be arranged such that, when the electronic devices are mounted to the rack coupling points 616 of the device rack, the electronic devices are arranged with a depth dimension of the electronic devices (extending from the front face 206, 302 to the rear face 208, 304 of the electronic device) aligned with the depth dimension $D_3$ of the device rack. In accordance with the ETSI standard, the device rack be sized to allow electronic devices having a maximum depth of 280 mm to be mounted on the rack.

In the arrangement shown in FIG. 6, the device rack 610 has a width in the lateral direction $D_2$, between the rack coupling points 616 at either lateral side of the device rack, of 19 inches. However, in other arrangements, the rack may have a different width. For example, the width may correspond to the dimension between the device coupling points 222, 322 provided on the device mounting brackets 220, 320 on either lateral side of the electronic devices that are to be mounted on the device rack.

The adaptor 620 comprises a coupling portion 630, configured for coupling to the device rack 610, and a mounting portion 640 configured for mounting one or more second electronic devices 300, e.g. of a second type or according to a second standard, on the adaptor 620.

The adaptor mounting portion 640 comprises a first mounting surface 642 and a second mounting surface 644. One or more adaptor coupling points 646 are spaced along the first and second mounting surfaces 642, 644 for coupling the second electronic devices to the adaptor. The adaptor coupling points 646 are arranged in a second plane $P_2$.

The adaptor coupling points 646 are provided in pairs with one coupling point of each pair being provided in each of the first and second mounting surface 642, 644. The first and second mounting surfaces 642, 644 may be spaced apart from one another by a distance corresponding to the distance between the device coupling points 222, 323, provided on the device mounting brackets 220, 320 on either lateral side of the second electronic devices, so that the first electronic devices 650 can be coupled to the first and second mounting surfaces 642, 644 of the adaptor with a width dimension of the second electronic devices extending between the first and second mounting surfaces 642, 644 of the adaptor. Accordingly, when the first electronic devices are mounted on the adaptor, the first electronic devices may be mounted on one or more adaptor device planes $P_{DA}$. In other words, the first electronic devices may be generally disposed within, or parallel with, the adaptor device planes $P_{DA}$ when mounted on the adaptor 620. The adaptor device planes $P_{DA}$ may be perpendicular to the second plane $P_2$. As depicted, the adaptor device pane $P_{DA}$ may be perpendicular to the rack device plane $P_{DR}$.

As depicted, the coupling portion 630 may be configured to couple to one or more of the coupling points 616 of the device rack 610 provided on one of the coupling surfaces 614 of the device rack, e.g. provided at one of the one lateral sides of the rack. In some arrangements, the coupling portion 630 may comprise a flange 632 comprising one or more fastener openings 634, which can be arranged to overlap the coupling surface 614 of the rack so that fasteners can be passed though the fastener openings 626 and the coupling points 616 of the device rack to couple the coupling portion 622 of the adaptor to the device rack 610.

In the arrangement shown in FIG. 6, the coupling portion 622 is coupled to the right side of the device rack 610. However, in other arrangements, the adaptor 620 may be coupled to the left side of the device rack 610. As depicted, the adaptor 620 may be configured, e.g. the adaptor coupling points 646 may be arranged relative to the coupling portion 622, such that, when the adaptor 620 is mounted on the device rack, the first and second mounting surfaces 642, 644 are spaced apart from one another in the longitudinal direction $D_1$ of the device rack. Accordingly, when the first electronic devices 650 are mounted on the adaptor 620 and the adaptor is coupled to the device rack 610, the first electronic devices 650 are arranged with a lateral dimension of the first electronic devices being aligned with the longitudinal direction $D_1$ of the device rack. Furthermore, a depth dimension of the first electronic devices 650 is aligned, e.g. at least partially aligned, with the lateral direction $D_2$ of the device rack 610. In this way, first electronic devices 650 having a depth greater than the maximum depth of electronic devices that the device rack is intended to support may be mounted on the device rack 610 and received within the interior space 618 of the device rack. As such, the electronic devices are mounted in a vertical plane. The plane of the planar electronic devices extends vertically and laterally across the width of the device rack.

Figure 7:
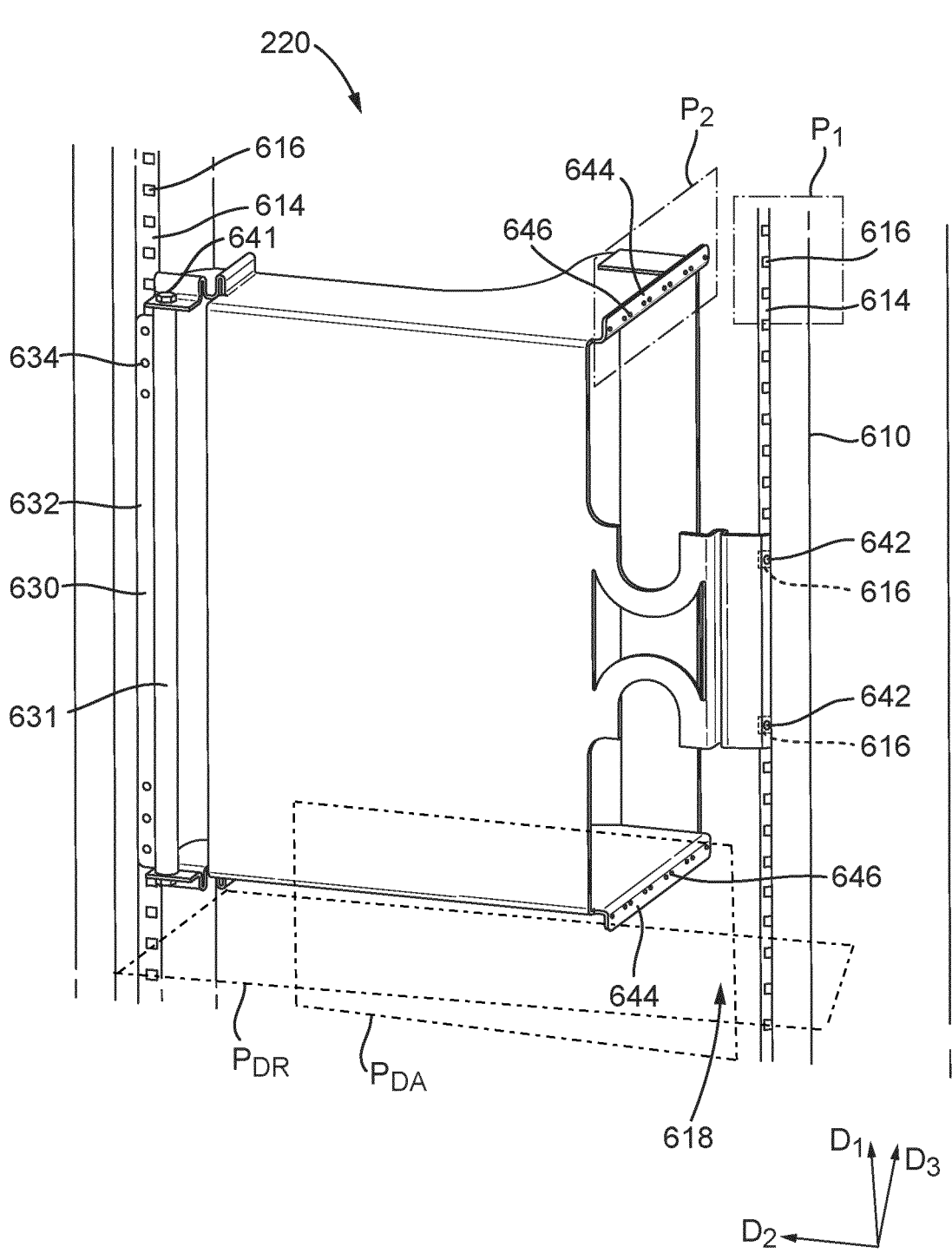
FIG. 7 is a front perspective view of the system for mounting electronic devices on a device rack, with an adaptor of the system is in a first position.
Figure 8:
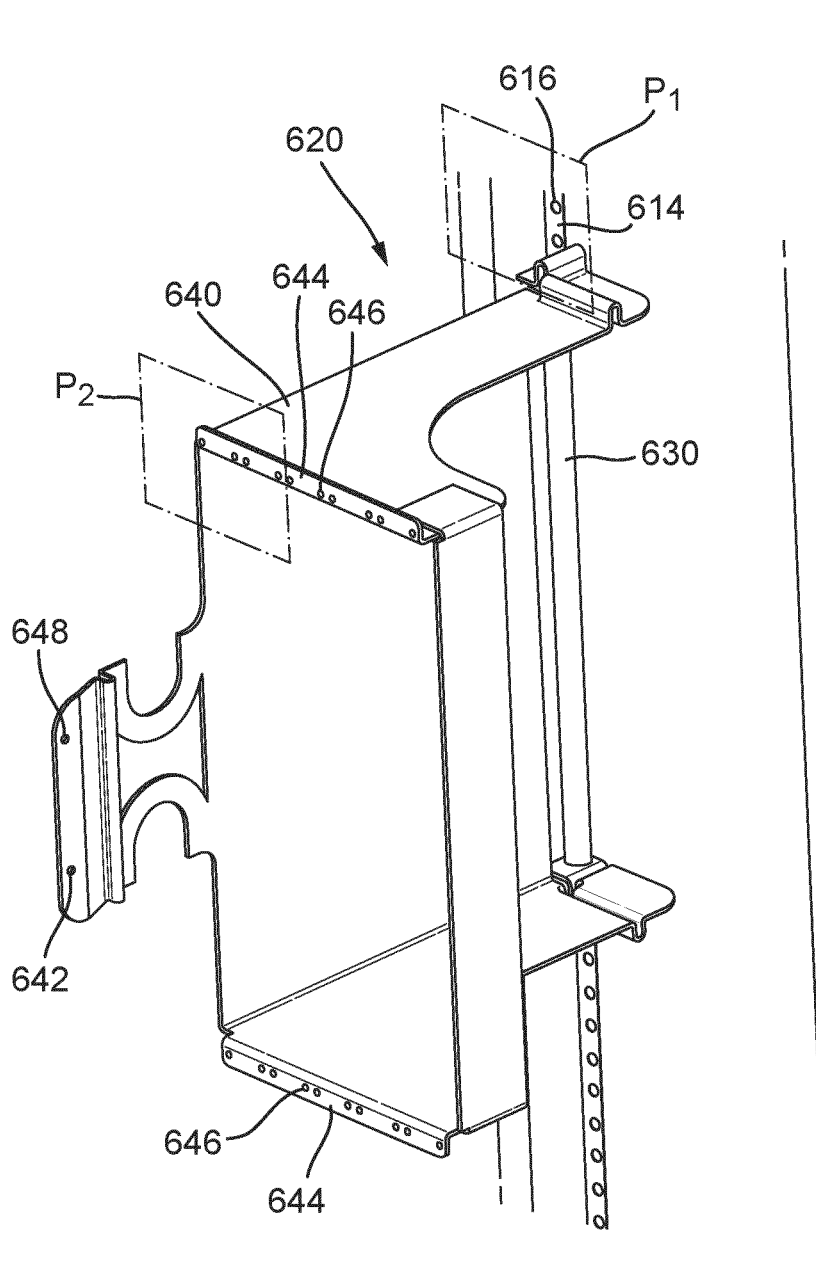
FIG. 8 is a front perspective view of the system for mounting electronic devices on a device rack, with the adaptor of the system is in a second position.
Figure 8:
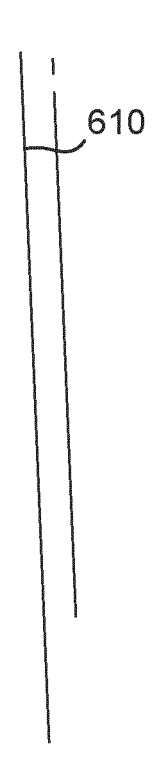

Referring now to FIGS. 7 and 8, the mounting portion 640 of the adaptor is movable relative to the coupling portion 630 of the adaptor. In particular, the mounting portion 640 is movable relative to the coupling portion between a first position, depicted in FIG. 7, and a second position, depicted in FIG. 8.

When the mounting portion 640 is in the first position relative to the coupling portion 630, the first electronic devices mounted on the adaptor 620 are received within the device rack, e.g. within the interior space 618, of the device rack and the second plane $P_2$ is at an angle relative to the first plane $P_1$. Further, as depicted, when the mounting portion 640 is in the first position relative to the coupling portion 630, the adaptor device plane $P_{DA}$ is parallel with lateral and longitudinal directions $D_1$, $D_2$ of the device rack 610.

When the mounting portion 640 is in the second position relative to the coupling portion 630, the first electronic devices mounted on the adaptor 620 may protrude out of the device rack, e.g. out of the interior space 618. The first electronic devices may protrude out by a greater amount than when the mounting portion 640 is in the first position relation to the coupling portion 630. In other words, the first electronic devices mounted on the adaptor 620 may be located at least partially outside of the device rack, for example, fully outside of the footprint of the device rack. Further, when the mounting portion 640 is in the second position relative to the coupling portion 630, the angle between the first plane $P_1$ and the second plane $P_2$ may be less than when the mounting portion 640 is in the first position relative to the coupling portion 630. For example, when the mounting portion 640 is in the second position relative to the coupling portion 630, the second plane $P_2$ may be parallel with the first plane $P_1$. In this way, access to the first electronic devices, e.g. to connections on the front or rear faces 302, 304 of the first electronic devices, may be improved compared to when the mounting portion 640 is in the first position relative to the coupling portion 630.

In the arrangement shown in FIGS. 6, 7 and 8, the mounting portion 640 is rotatably movable relative to the coupling portion 630. For example, the coupling portion 630 comprises an apparatus, e.g. a hollow cylindrical portion 631, which defines a pivot axis, e.g. vertical pivot axis. For example, the mounting portion 640 is coupled to the coupling portion 630 by a pin 641 extending though the hollow cylindrical portion 631 of the mounting portion. However, in other arrangements, the mounting portion 640 may be slideably movable relative to the coupling portion 630 in addition or as an alternative to being rotatably movable. For example, the mounting portion 640 may be coupled to the coupling portion 630 via one or more rollers. In this way, the mounting portion 640 of the adaptor 620 may be slid into and out of the device rack 610 between the first and second positions.

As depicted in FIGS. 6, 7 and 8, the mounting portion 640 may comprise one or more coupling points 648, such as fastener openings, for enabling the mounting portion 640 to be coupled to one of the coupling surfaces 614 of the device rack 610. For example, the mounting portion 640 may be couplable to the rack coupling points 616 provided on the coupling surface 614 of the device rack 610 at an opposite lateral side of the device rack from the side at which the coupling portion 630 of the adaptor is coupled to the device rack 610. As shown in FIG. 7, when the mounting portion 640 is in the first position relative to the coupling portion 630, the coupling points 648 of the mounting portion may be aligned with the rack coupling points 616 of the coupling surface, such that the mounting portion 640 may be coupled to the coupling surface 614 of the device rack 610 when the mounting portion 640 of the adaptor is in the first position relative to the coupling portion 630.

The mounting portion 640 is rotatably mounted to the standard coupling points of the device rack. This allows the electronic devices, fixed to the mounting portion 640 of the adaptor, to move between a desired first position and orientation within the device rack and a second position in which the electronic devices can be efficiently removed or added to the adaptor. The plane of the electronic devices is vertical, in both the first and second positions. In the first position, the electronic devices extend laterally in the device rack. In the second position, the electronic devices extend at an angle to that lateral direction, e.g. perpendicular to that lateral direction.

As shown in FIG. 8, when the mounting portion 640 is in the second position relative to the coupling portion 630, the coupling points 648 of the mounting portion may be spaced apart from the rack coupling points 616 of the coupling surface 614, such that the mounting portion 640 is not couplable to the coupling surface of the devices rack when the mounting portion 640 of the adaptor is in the second position relative to the coupling portion 630.

Figure 9:
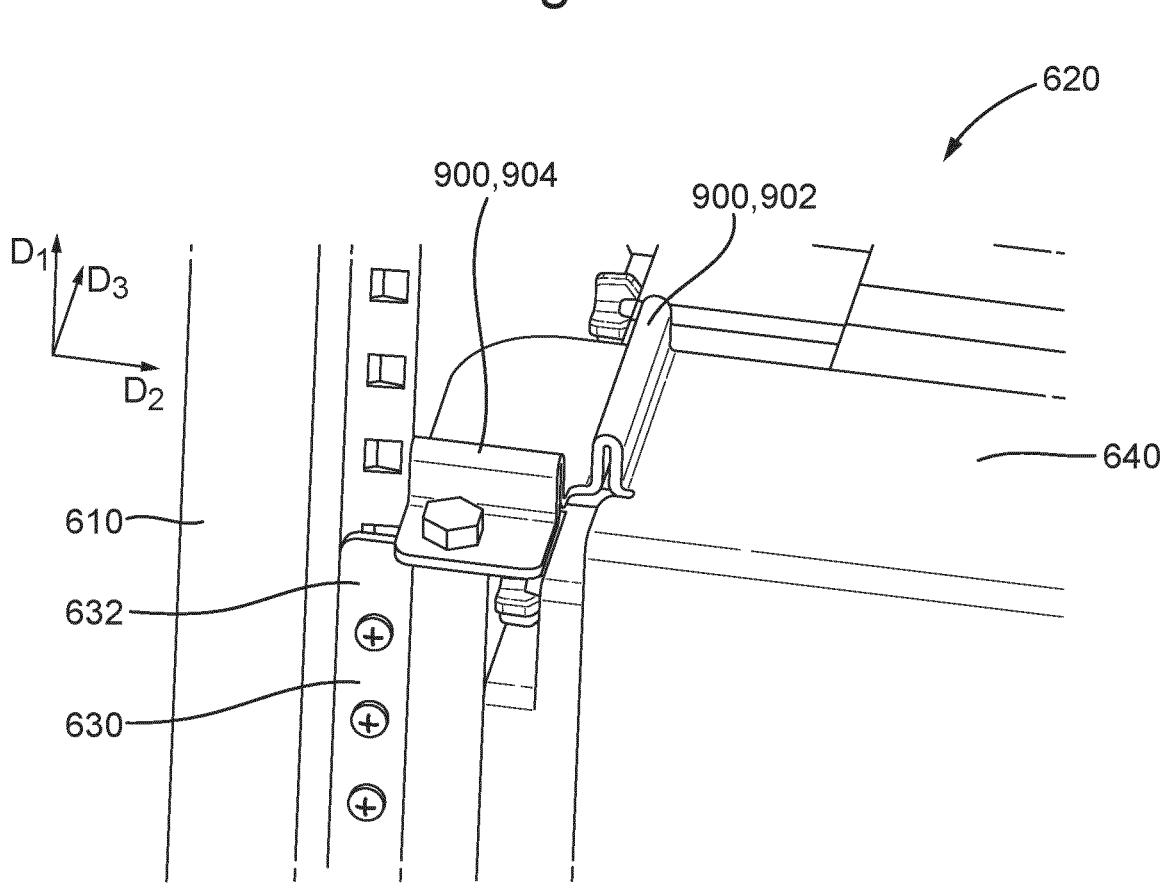
FIG. 9 is a partial perspective view of the adaptor shown in FIGS. 6 to 8, illustrating a vibration damping portion of the adaptor.
Figure 10:
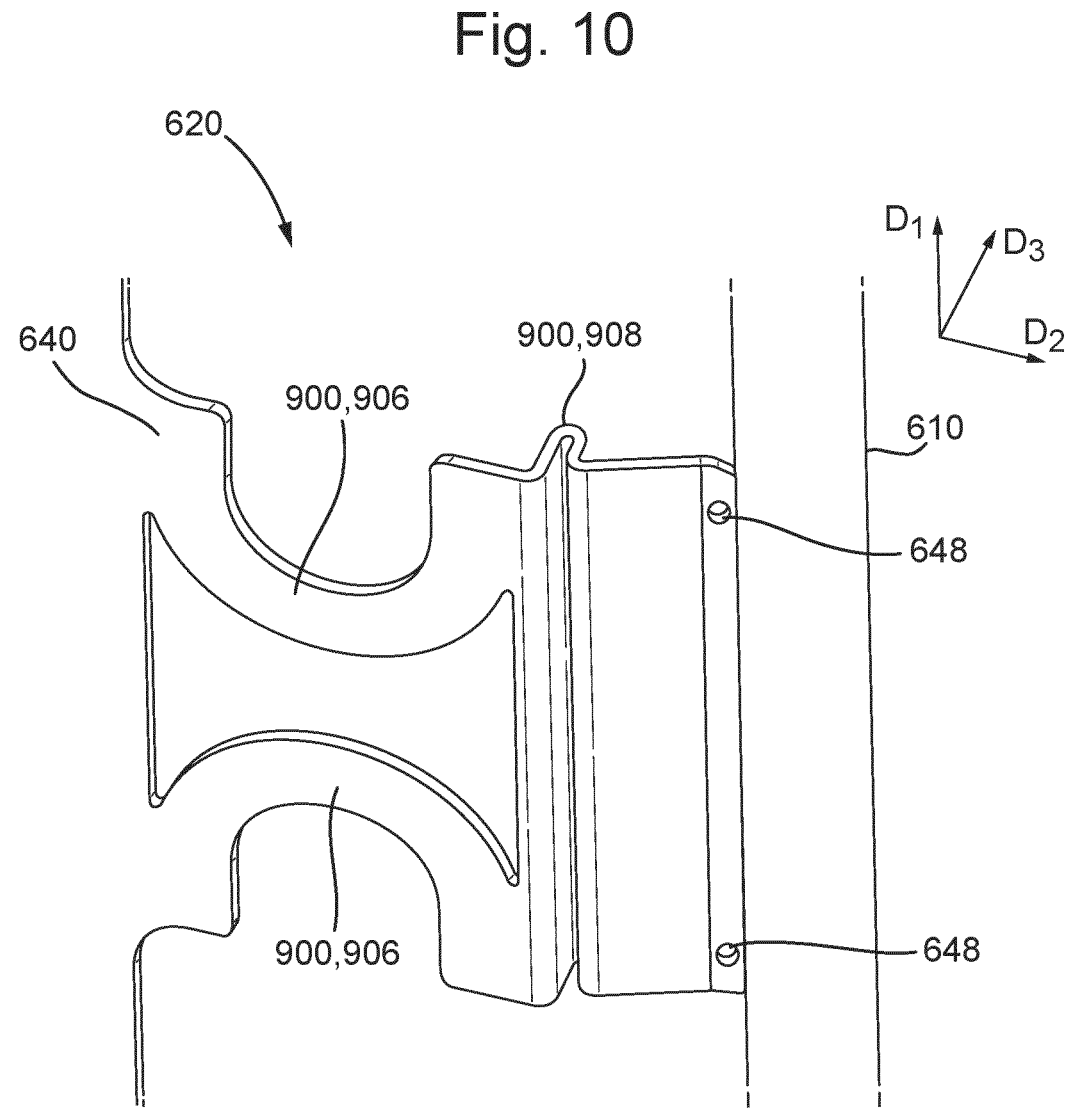

With reference to FIGS. 9 and 10, the adaptor may comprise one or more vibration damping portions 900 configured, e.g. shaped, for damping vibrations of the first electronic devices 650 to the device rack 610 and/or of the device rack 610 relative to the first electronic devices 650. The vibration damping portions 900 may be configured, e.g. shaped, to reduce the amplitude of loads transmitted from the first electronic devices 650 to the device rack 610 and/or from the device rack 610 to the first electronic devices 650. Accordingly, one or more of the vibration damping portions 900 may be provided on the adaptor 620 between, e.g. in a load path between, the position(s) on the coupling portion 630 at which that coupling portion is coupled to the device rack and the mounting portion 640, e.g. the adaptor coupling points 646 on the mounting portion. Additionally or alternatively, one or more of the vibration damping portions 900 may be provided on the adaptor between, e.g. in a load path between, the position on the mounting portion at which the mounting portion 640 is couplable to the device rack, e.g. the coupling points 646 of the mounting portion, and the adaptor coupling points 646 on the mounting portion.

The vibration damping portions 900 may be configured to damp vibrations and/or reduce the amplitude of the transmission of loads in first, second and/or third damping directions $D_{D1}$, $D_{D2}$, $D_{D3}$. In particular, the vibration damping portions 900 may comprise one or more first vibration damping portions 902 configured to damp vibrations and/or reduce the transmission of loads in second and third damping directions $D_{D2}$, $D_{D3}$. Additionally or alternatively, the adaptor may comprise one or more second vibration damp-ing portions 904 configure to damp vibrations and/or reduce the transmission of loads in first and third damping directions $D_{D1}$, $D_{D3}$.

As shown in FIGS. 6, 7 and 8, the mounting portion 640 of the adaptor 620 may be coupled to the coupling portion 630 at a plurality of locations. For example, when the adaptor 620 is to be coupled to one of the coupling surfaces 614 at a lateral side of the device rack 610, the mounting portion may be coupled to the coupling portion at upper and lower ends of the mounting portion 640, e.g. space apart in the longitudinal direction of the device rack.

In such arrangements, one or more of the vibrations damping portions, e.g. first and second vibrations damping portions, may be provided on the adaptor 620 corresponding to each of the positions at which the mounting portion 640 is coupled to the coupling portion 630. In other words, the vibrations damping portions may be provided in each of the load paths established by the adaptor 620 between the position(s) on the coupling portion 630 at which that coupling portion is coupled to the device rack 610 and the mounting portion 640, e.g. the adaptor coupling points 646 on the mounting portion.

In the arrangements shown, the first and second vibration damping portions 902, 904 are provided on the mounting portion 640 of the adaptor and are configured to damp vibrations and/or reduce the amplitude of loads transmitted in first, second and or third damping directions $D_{D1}$, $D_{D2}$, $D_{D3}$, which are defined relative to the mounting portion 640 of the adaptor. However, in other arrangements, the vibration damping portions may be provided on the coupling portion 630 of the adaptor. In such arrangements, the first, second and third damping directions may be defined relative to the coupling portion of the adaptor. The first, second and third damping directions may be defined such that, when the adaptor is in the first position, the first damping direction DD, is aligned with the longitudinal direction $D_1$ of the device rack, the second damping direction $D_{D2}$ is aligned with a lateral direction $D_2$ of the device rack and the third damping direction $D_{D3}$ is aligned with the third direction $D_3$ of the device rack.

Referring now to FIG. 10, the adaptor 620 may further comprise one or more third and/or one or more fourth vibration damping portions 906, 908 that are provided on the adaptor 620 between, e.g. in a load path between, the adaptor coupling points 646 on the mounting portion and the cou-pling points 646 on the mounting portion at which the mounting portion is couplable to the device rack 610. In particular, the adaptor may comprise one or more third vibration damping portions 906 configured, e.g. shaped, to damp vibrations and/or reduce the transmission of loads in the first and third damping directions $D_{D1}$, $D_{D3}$. Additionally or alternatively, the adaptor 620 may comprise one or more fourth vibration damping portions 908, configured to damp vibrations and/or reduce the transmission of loads in the second and third damping directions $D_{D2}$, $D_{D3}$.

As depicted in FIGS. 9 and 10, the vibration damping portions 900 may comprise portions of the adaptor 620 having a curved profile in a cross-section in a plane parallel with the directions in which the vibration damping portion is to damp vibrations and/or reduce the transmission of loads.

Figure 11:
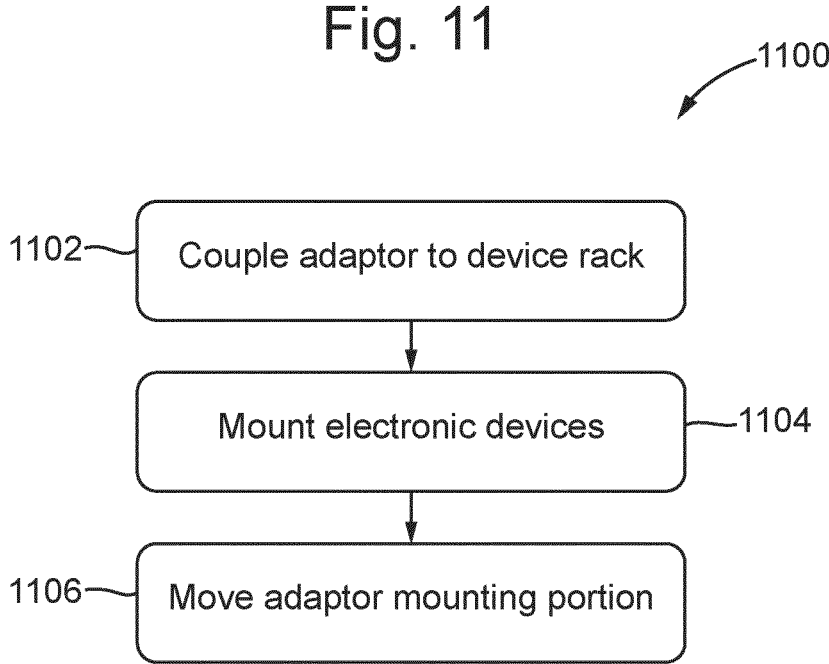
FIG. 11 is a flow chart illustrating a method of mounting an electronic device according to the present disclosure.

With reference to FIG. 11, a method 1100 of mounting one or more first electronic devices, e.g. of a first type or according to a first standard, on a device rack system will now be described.

The system comprises a device rack comprising a plural-ity of rack mounting points for mounting one or more second electronic devices, e.g. of a second type or according to a second standard, on the device rack. The system further comprises an adaptor comprising a coupling portion for coupling to the device rack and a mounting portion comprising one or more adaptor mounting points for mounting the one or more first electronic devices on the adaptor. The mounting portion is movable relative to the coupling portion between a first position and a second position. For example, the system may comprise the system 600 described above with reference to FIGS. 6 to 10.

The plurality of rack mounting points may be arranged in a first plane. The one or more adaptor mounting points may be arranged in a second plane.

The method comprises a first step 1102, at which the adaptor is coupled to the device rack such that, when the mounting portion is in the first position, the first electronic devices mounted on the adaptor are located, e.g. received, within the device rack, e.g. within an interior space of the device rack, and are mounted on one or more planes which extend vertically and laterally relative to the device rack. The adaptor may be coupled to the device rack such that when the mounting portion is in the second position, the first electronic devices mounted on the adaptor are located at least partially outside of the device rack.

The adaptor may be coupled to the device rack such that, when the mounting portion is in the first position, the second plane is at an angle, e.g. is perpendicular, relative to the first plane.

The method 1100 may further comprise a second step 1104, at which one or more first electronic devices are mounted on the adaptor, e.g. to the mounting portion of the adaptor. The method 1100 may further comprise a third step, at which the mounting portion of the adaptor is moved relative to the coupling portion. For example, the mounting portion of the adaptor may be moved from the first position towards the second position or vice versa.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

It will be appreciated by those skilled in the art that although the invention has been described by way of example, with reference to one or more exemplary examples, it is not limited to the disclosed examples and that alternative examples could be constructed without departing from the scope of the invention as defined by the appended claims.

The invention claimed is:

1. An adaptor for mounting one or more substantially planar first electronic devices on a device rack, wherein the adaptor comprises:
   a coupling portion configured to couple to the device rack; and

14 a mounting portion comprising one or more adaptor mounting points configured for mounting the first electronic devices on the adaptor, wherein the mounting portion comprises first and second mounting surfaces configured to couple to the first electronic devices, the first and the second mounting surfaces being spaced apart from one another in a vertical direction of the adaptor, wherein the mounting portion is movable relative to the coupling portion between a first position and a second position such that, when the adaptor is coupled to the device rack and the mounting portion is in the first position, the first electronic devices mounted on the adaptor are located within the device rack and are mounted on one or more planes which extend vertically and laterally relative to the device rack, wherein a lateral dimension of the first electronic devices is aligned with the vertical direction of the adaptor and a depth direction of the first electronic devices is aligned with a lateral direction of the adaptor, and when the mounting portion is in the second position, the first electronic devices mounted on the adaptor are located at least partially outside of the device rack.

2. The adaptor of claim 1, wherein the mounting portion is rotatable relative to the coupling portion.

3. The adaptor of claim 1, wherein the mounting portion is rotatable relative to the coupling portion about a vertical axis.

4. The adaptor of claim 1, wherein, when in use, the device rack is configured to comprise a plurality of rack mounting points arranged in a first plane for mounting one or more second electronic devices on the device rack and wherein the one or more adaptor mounting points for mounting the first electronic devices on the adaptor are arranged in a second plane, wherein, when the adaptor is coupled to the device rack and the mounting portion is in the first position, the second plane is at an angle relative to the first plane.

5. The adaptor of claim 4, wherein the coupling portion of the adaptor is configured to couple to the rack mounting points of the device rack.

6. The adaptor of claim 1, wherein the mounting portion comprises one or more coupling points configured to couple the mounting portion to the device rack.

7. The adaptor of claim 4, wherein when the adaptor is coupled to the device rack and the mounting portion is in the second position, the angle between the second plane and the first plane is less than when the mounting portion is in the first position.

8. The adaptor of claim 1, wherein the adaptor comprises one or more vibration damping portions configured to dampen vibrations of the first electronic devices mounted on the adaptor relative to the device rack and/or of the device rack relative to the first electronic devices mounted on the adaptor.

9. The adaptor of claim 8, wherein the vibration damping portions comprise portions of the adaptor having curved profiles in cross-sections in planes parallel with directions in which the respective vibration damping portions are to damp vibrations.

10. A system for mounting one or more substantially planar first electronic devices on a device rack, the system comprising:
   the device rack, wherein the device rack comprises a plurality of rack mounting points for mounting one or more second electronic devices on the device rack; and
   an adaptor, wherein the adaptor comprises a coupling portion configured to couple to the device rack, and a mounting portion comprising one or more adaptor mounting points configured for mounting the first electronic devices on the adaptor, wherein the mounting portion comprises first and second mounting surfaces configured to couple to the first electronic devices, the first and the second mounting surfaces being spaced apart from one another in a vertical direction of the adaptor, wherein the mounting portion is movable relative to the coupling portion between a first position and a second position such that, when the adaptor is coupled to the device rack and the mounting portion is in the first position, the first electronic devices mounted on the adaptor are located within the device rack and are mounted on one or more planes which extend vertically and laterally relative to the device rack, wherein a lateral dimension of the first electronic devices is aligned with the vertical direction of the adaptor and a depth direction of the first electronic devices is aligned with a lateral direction of the adaptor, and when the mounting portion is in the second position, the first electronic devices mounted on the adaptor are located at least partially outside of the device rack.

11. The system of claim 10, wherein the device rack is configured for mounting the second electronic devices such that a depth dimension of the second electronic devices extends in a depth dimension of the device rack, wherein the device rack is for mounting second electronic devices having a second maximum dimension in a depth dimension, and wherein the adaptor is configured for mounting first electronic devices having a first maximum dimension in the depth dimension of the first electronic devices, the first maximum dimension being greater than the second maximum dimension.

12. The system of claim 10, wherein the adaptor is couplable to the device rack such that, when the mounting portion is in the first position, the first electronic devices mounted on the adaptor are received within the device rack with a depth dimension of the first electronic devices being aligned with a lateral direction of the device rack.

13. The system of claim 10, wherein the device rack is a European Telecommunication Standard Institute (ETSI) standard device rack.

14. A method of mounting one or more substantially planar first electronic devices on a device rack system, the system comprising:

a device rack comprising a plurality of rack mounting points for mounting one or more second electronic devices on the device rack; and an adaptor comprising a coupling portion configured to couple to the device rack and a mounting portion comprising one or more adaptor mounting points configured for mounting the one or more first electronic devices on the adaptor, wherein the mounting portion comprises first and second mounting surfaces configured to couple to the first electronic devices, the first and the second mounting surfaces being spaced apart from one another in a vertical direction of the adaptor, wherein the mounting portion is movable relative to the coupling portion between a first position and a second position, wherein the method comprises:

coupling the adaptor to the device rack in such a way that when the adaptor is coupled to the device rack and the mounting portion is in the first position, the first electronic devices mounted on the adaptor are located within the device rack and are mounted on one or more planes which extend vertically and laterally relative to the device rack, wherein a lateral dimension of the first electronic devices is aligned with the vertical direction of the adaptor and a depth direction of the first electronic devices is aligned with a lateral direction of the adaptor, and when the mounting portion is in the second position, the first electronic devices mounted on the adaptor are located at least partially outside of the device rack.

15. The method of claim 14, wherein the method further comprises moving the mounting portion of the adaptor relative to the coupling portion between the first and second positions.

* * * * *